(12) United States Patent
Yu et al.

(10) Patent No.: US 11,422,291 B2
(45) Date of Patent: Aug. 23, 2022

(54) METHOD FOR CONDITIONING A REPLICATION TOOL AND RELATED METHOD FOR MANUFACTURING A MULTITUDE OF DEVICES

(71) Applicant: Heptagon Micro Optics Pte. Ltd., Singapore (SG)

(72) Inventors: Qichuan Yu, Singapore (SG); Han Nee Ng, Singapore (SG); Tobias Senn, Singapore (SG); John A. Vidallon, Singapore (SG); Ramon Opeda, Jr., Singapore (SG); Attilio Ferrari, Rüschlikon (CH); Hartmut Rudmann, Rüschlikon (CH); Martin Schubert, Rüschlikon (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 166 days.

(21) Appl. No.: 16/611,338

(22) PCT Filed: May 2, 2018

(86) PCT No.: PCT/SG2018/050213
§ 371 (c)(1),
(2) Date: Nov. 6, 2019

(87) PCT Pub. No.: WO2018/208229
PCT Pub. Date: Nov. 15, 2018

(65) Prior Publication Data
US 2020/0200949 A1 Jun. 25, 2020

Related U.S. Application Data

(60) Provisional application No. 62/503,464, filed on May 9, 2017.

(51) Int. Cl.
*G02B 3/00* (2006.01)
*B29D 11/00* (2006.01)
(Continued)

(52) U.S. Cl.
CPC ............ *G02B 3/0031* (2013.01); *B29C 43/36* (2013.01); *B29D 11/00* (2013.01); *G03F 7/0002* (2013.01);
(Continued)

(58) Field of Classification Search
CPC .............. B29D 11/00365; B29D 11/00; B29D 11/00298; G02B 3/0031; G03F 7/0002; G03F 7/0015; B29C 43/36
See application file for complete search history.

(56) References Cited

U.S. PATENT DOCUMENTS 4,876,042 A * 10/1989 Imataki ................... B29C 33/72
264/39
2004/0256764 A1 12/2004 Choi et al.
(Continued)

FOREIGN PATENT DOCUMENTS

CN 101770164 A 7/2010

OTHER PUBLICATIONS

International Search Report issued for corresponding International Application No. PCT/GB2018/050213 dated Aug. 1, 2018.
(Continued)

*Primary Examiner* — Mathieu D Vargot
(74) *Attorney, Agent, or Firm* — Michael Best & Friedrich LLP

(57) ABSTRACT

The method for manufacturing a multitude of devices comprises:
  providing a replication tool comprising a tool material;
  conditioning the replication tool, wherein the conditioning comprises applying a treatment to the tool material,
(Continued)

wherein the treatment comprises exposing the tool material to a conditioning material.

And it further comprises, after the conditioning:

carrying out one or more replication processes, wherein in each of the one or more replication processes, one or more of the devices are produced from a replication material by replication using the replication tool.

The treatment can comprise dimensionally changing the tool material by the exposure of the tool material to the conditioning material. Before carrying out the replication processes, the conditioning material can be hardened and removed.

20 Claims, 3 Drawing Sheets

(51) Int. Cl.
*G03F 7/00* (2006.01)
*B29C 43/36* (2006.01)

(52) U.S. Cl.
CPC .. *B29D 11/00298* (2013.01); *B29D 11/00365* (2013.01); *G03F 7/0015* (2013.01)

(56) References Cited

U.S. PATENT DOCUMENTS

| | | |
|---|---|---|
| 2008/0230773 A1 | 9/2008 | Dickey et al. |
| 2009/0061039 A1 | 3/2009 | Zhang et al. |
| 2009/0266418 A1 | 10/2009 | Hu et al. |
| 2011/0126730 A1 | 6/2011 | Berniard et al. |
| 2011/0151134 A1 | 6/2011 | Kao et al. |
| 2012/0244286 A1 | 9/2012 | Kobayashi |
| 2013/0140744 A1 | 6/2013 | Nakai et al. |
| 2014/0151733 A1 | 6/2014 | Koike et al. |

OTHER PUBLICATIONS

International Preliminary Report on Patentability for Application No. PCT/SG2018/050213 dated Nov. 12, 2019 (7 pages).

* cited by examiner

METHOD FOR CONDITIONING A REPLICATION TOOL AND RELATED METHOD FOR MANUFACTURING A MULTITUDE OF DEVICES

CROSS-REFERENCE TO RELATED APPLICATION(S)

This application is a National Stage Entry of Application No.: PCT/SG2018/050213 filed May 2, 2018, which claims benefit of priority of U.S. Provisional Patent Application No. 62/503,464, filed on May 9, 2017. The entire contents of the earlier application are incorporated herein by reference.

TECHNICAL FIELD

The invention relates to the manufacture of devices, e.g., optical devices, by means of replication. More particularly, the invention relates to conditioning of replication tools. It relates to methods according to the opening clauses of the claims. Such methods find application, e.g., in mass production of micro-optical devices.

Definition of Terms

"Passive optical component": An optical component redirecting light by refraction and/or diffraction and/or (internal and/or external) reflection such as a lens, a prism, a mirror (plane or curved), optical filter, or an optical system, wherein an optical system is a collection of such optical components possibly also comprising mechanical elements such as aperture stops, image screens, holders.

"Replication": A technique by means of which a given structure or a negative thereof is reproduced. E.g., etching, embossing (imprinting), casting, molding.

"Wafer": A substantially disk- or plate-like shaped item, its extension in one direction (z-direction or vertical direction or stacking direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Light": Most generally electromagnetic radiation; more particularly electromagnetic radiation of the infrared, visible or ultraviolet portion of the electromagnetic spectrum.

BACKGROUND OF THE INVENTION

Ways of manufacturing optical devices on wafer level are known in the art. E.g., dozens or hundreds of lenses are produced in a single wafer-level replication process. A corresponding wafer-level replication tool can be used in a number of successive replication processes, so as to produce a number of times said dozens or hundreds of lenses using one and the same replication tool.

In mass production in general, and particularly in mass production of optical devices, reproducibility is of tremendous importance, as the properties of congeneric devices produced this way should be deviating as little as possible. Achieving a high reproducibility can result in high production yields and can simplify the overall manufacturing process by reducing efforts for reworking manufactured devices or of sorting out devices with properties deviating too much from set values.

It is thus highly desirable to achieve a high degree of process stability in replication, in particular in mass production.

SUMMARY OF THE INVENTION

An example of an advantage of a version of the invention is to achieve a high process stability in mass production of replicated devices, such as in replicated optical devices.

Another example of an advantage of a version of the invention is to provide a method for manufacturing devices by replication which results in a particularly high yield.

Another example of an advantage of a version of the invention is to provide a way of providing replication tools by means of which devices can be produced which have dimensions showing only very little deviations from one to another.

Further objects and various advantages emerge from the description and embodiments below.

At least one of these objects can be achieved in some implementations of methods described in this disclosure.

Investigations by the inventors did result in discovering that dimensional changes of replicated devices seem to exist which show some dependence on the time at which the replication process has taken place. And the inventors did determine that such dimensional changes apparently can depend on the history of the replication tool used in the replication process.

According to the inventors, a significant improvement in replication processes can be achievable when conditioning the replication tool before use. They determined that a notably reduced dimensional deviation between replicated devices can be achievable when subjecting replication tools to a treatment prior to the replication processes.

The inventors invented a novel method for manufacturing a multitude of devices and a related method for conditioning a replication tool.

The replication tool includes a tool material. The tool material can be, e.g., a resilient material such as, e.g., a silicone. This way, the replication tool can, e.g., compensate, by means of the resilience of tool material, lacking planarity of a substrate on which the devices are produced in the replication process.

In an exemplary replication process, such as in an embossing process, a replication material in a deformable state, e.g., in a liquid state, present between the replication tool and the substrate, can be shaped by the replication tool, more specifically by replication sites established by the tool material, and then hardened, such as by exposure to energy such as heat and/or irradiation with light. Then, the replication tool is removed, and the so-obtained devices remain on the substrate.

The tool material can be the material of the replication tool which is brought into contact with the replication material in a replication process.

The replication tool can have one or more replication sites in which the replication material is shaped, and the tool material can be the material forming a replication surface in each of the replication sites. Each of the replication surfaces is shaped to exhibit the negative of the shape of a surface of a device to be produced.

In addition to the tool material, the replication tool can include a dimensionally stable (rigid) carrier, e.g., a plate, such as, e.g., a glass plate or a metal plate, to which the tool material is attached. This can facilitate handling the replication tool and ensure an overall dimensional stability of the replication tool, and also of the tool material.

The inventors determined that the exposure to the (not-yet hardened) replication material during the replication process apparently can provoke dimensional changes of the tool material and thus of the size of the replication surfaces. And moreover, the inventors determined that apparently, further dimensional changes are provoked in reaction to further exposures of the tool material to the (not-yet hardened) replication material during subsequent replication processes with the same replication tool. This effects that dimensions of devices are not identical when the devices are produced in subsequent replication processes with the same replication tool, thus constituting an obstacle for high-precision mass production.

The method for manufacturing a multitude of devices includes:
  providing a replication tool including a tool material;
  conditioning the replication tool, wherein the conditioning includes applying a treatment to the tool material, wherein the treatment includes exposing the tool material to a conditioning material;
and the method further includes, after the conditioning:
  carrying out one or more replication processes, wherein in each of the one or more replication processes, one or more of the devices are produced from a replication material by replication using the replication tool.

The related method for conditioning a replication tool including a tool material includes applying a treatment to the tool material, wherein the treatment includes exposing the tool material to a conditioning material.

The conditioning of the replication tool can strongly reduce the above described dimensional changes provoked in the tool material, such that a very high degree of process stability can be achievable, thus making it possible to produce devices of very precisely predictable dimensions already in a first replication process with a replication tool.

And, perhaps even more importantly, this can make possible to produce devices of very constant dimensions in successively accomplished replication processes with one and the same replication tool. In other words, instead of having to cope with notable and possibly unacceptable size variations between devices produced in different replication processes carried out with one and the same replication tool, such size variations are strongly reduced by the conditioning, thus resulting in a strongly increased production yield.

The conditioning can be particularly valuable in the manufacture of optical devices, such as of passive optical components, e.g., of lenses, as for these, the functional properties of the respective device are often intrinsically linked to the dimensions of the device.

In some embodiments, the treatment includes dimensionally changing the tool material by the exposure of the tool material to the conditioning material.

In some embodiments, the treatment includes dimensionally changing the tool material by uptake of the conditioning material in the tool material. E.g., a swelling of the tool material may be provoked by the treatment.

In some embodiments, the tool material has an open porous structure. And it can be, in addition, a resilient material.

In some embodiments, the tool material has a spongy structure.

In these cases, the conditioning can effect that a portion of the conditioning material permeates into the tool material, as the replication material may do when applied to the replication material in a replication process.

And moreover, the deformability of the tool material can level insufficient planarity of the substrate on which the devices are replicated.

Accordingly, in some embodiments, the treatment includes letting a portion of the conditioning material permeate into the tool material.

Dimensional changes otherwise provoked (i.e. provoked without the conditioning) by replication material permeating into the tool material in a replication process can be reduced this way, as the permeation of replication material into the tool material can be blocked to a large extent, because the tool material is already permeated by the conditioning material.

In some embodiments, the tool material is interspersed with pores and/or channels (e.g., in a spongy and/or open porous material), and a portion of the fluid present in at least a portion of the pores and channels, respectively, prior to the treatment is replaced by the treatment by a portion of the conditioning material. E.g., the tool materials can be filled with a fluid prior to the treatment, more specifically, the pores and channels, respectively, are filled with a fluid. The fluid can be, e.g., a liquid. E.g., in case of a silicone as the tool material, the pores and channels, respectively, can initially be filled with uncured (i.e. not cross-linked) silicone, e.g., with PDMS precursors.

In some embodiments, the fluid effects that a separation of a hardenable material such as of a hardened replication material from the tool material is facilitated. E.g., the fluid can form a film on the tool material which reduces an adhesion between the replication material (or the conditioning material) and the tool material.

In some embodiments, the tool material is a polydimethylsiloxane (PDMS).

In order to ensure a sufficient interaction between the conditioning material and the tool material, the exposure of the tool material to the replication material should be sufficiently long:

E.g., the treatment can include exposing the tool material to the conditioning material for at least thirty minutes, or in instances more than eight hours.

Or, e.g., the treatment includes exposing the tool material to the conditioning material for a time duration which is at least half as long as a time duration required for achieving a saturation of the tool material with the conditioning material. This is likely to result in strongly reduced dimensional changes during subsequent replication processes.

Or, e.g., the treatment includes exposing the tool material to the conditioning material at least until at least 50% or more particularly at least 80% of a saturation of the tool material with the conditioning material is reached. This, too, is likely to result in strongly reduced dimensional changes during subsequent replication processes.

Or, e.g., the tool material is exposed to the conditioning material for a first time duration (before removing the conditioning material from the replication tool, and in case the conditioning material is hardened before removing it:

before the hardening the conditioning material), and in each of the one or more replication processes, the tool material is exposed to the replication material for a respective second time duration before hardening the replication material and removing the replication material from the replication tool, and the first time duration exceeds each of the second time durations, e.g., by a factor of at least five, or in instances, by a factor of at least twenty.

For example, the conditioning material in its initial (e.g., liquid) state is applied to the tool material for twelve hours and is then hardened and removed from the replication tool; and later, during a first replication process (and possibly also during further replication processes), the replication material is applied to the tool material for less than ten minutes and then hardened and removed from the replication tool.

In some embodiments, the treatment includes applying the conditioning material at least to all regions of the tool material to which the replication material is applied in the subsequent one or more replication processes.

In some embodiments, the tool material establishes a plurality of mutually distanced replication sites, and during each of the one or more replication processes, a separate portion of replication material is locally applied to a respective one of the replication sites. This can be a time-consuming process, whereas an application of the conditioning material to the tool material can be accomplished in such a way that a layer of conditioning material is produced on the tool material which interconnects all replication sites, e.g., by simply covering the whole surface of the tool material, possibly with the exception of side faces.

In some embodiments however, the tool includes one or more replication sites (as described), and the tool material establishes a replication surface in each of the one or more replication sites. And the treatment includes, for each of the replication surfaces, applying the conditioning material to the respective replication surface, in particular applying to each respective replication surface a separate portion of the conditioning material. And, e.g., the treatment can include, too, for each of the replication surfaces, covering with the conditioning material the respective replication surface and, optionally, in addition, a surface region of the tool material adjacent to and surrounding the respective replication surface.

For example, when during replication, the replication material is applied only locally (and not all over the tool material), this can be a way to ensure that the conditioning material effects the tool material at least where the tool material will be exposed to the replication material during replication processes.

In some embodiments, a continuous layer of the conditioning material is applied to the tool material, covering all replication sites of the replication tool. This simplifies the treatment and ensures interaction between the conditioning material and the tool material in all relevant locations.

In some embodiments, the exposure of the tool material to the conditioning material is terminated by hardening the conditioning material.

In some embodiments, the exposure of the tool material to the conditioning material is terminated by removing the conditioning material from the replication tool.

In some embodiments, the conditioning material is a material which is liquid or plastically deformable in an initial state and which can be transformed into a hardened state by exposure to energy, and wherein during exposing the tool material to the conditioning material, the conditioning material is in its initial state.

In some embodiments, the conditioning material is a curable material in its uncured state. Curing (and, thus, hardening) the replication material can be accomplished, e.g., by irradiation, e.g., with UV light, and/or by heating the conditioning material.

In some embodiments, the treatment includes (at the end of the exposure of the tool material to the conditioning material): transforming the conditioning material into its hardened state and removing the hardened conditioning material from the replication tool. This is an elegant way of removing the conditioning material from the tool material.

In some embodiments, the method includes: after application of the conditioning material to the replication tool, attaching a substrate to the conditioning material, in particular wherein the substrate is attached during most of the time during which the tool material is exposed to the conditioning material. And more particularly, the conditioning material can be hardened (e.g., cured) while attached to the substrate. Furthermore, the removal of the (hardened) conditioning material from the replication tool can include separating the substrate, with the conditioning material attached, from the replication tool. This can greatly facilitate the removal of the conditioning material from the replication tool. And in instances, the conditioning can this way more strongly mimic a replication process to be carried out later, in particular with regard to the way the conditioning material and the replication material, respectively, interact with the tool material; wherein, as indicated, the interaction times will usually be notably different.

In some embodiments, the method includes, subsequent to the exposing of the tool material to the conditioning material, retaining the replication tool for another time duration. This can facilitate providing good start conditions for a subsequent manufacturing phase (in which devices are manufactured by replication).

In particular, said other time duration can be at least 0.2 times as long, at least 0.5 times as long, or more particularly at least as long as the time duration during which the tool material is exposed to the conditioning material. E.g., said other time duration can be at least twice as long as the time duration during which the tool material is exposed to the conditioning material (before hardening).

Depending on the circumstances, said other time duration can be, e.g., at least 30 minutes, at least 2 hours, or even at least 24 hours.

E.g., the time duration during which the tool material is exposed to the conditioning material can be between 8 hours and 3 days and the other time duration during which the replication tool is retained can be between 4 hours and 6 days.

For example, both said time durations can be determined, experimentally, in dependence of time durations used in a subsequent manufacturing phase.

During the retaining, the replication tool can be simply shelved or stored or otherwise reposited, e.g., under climatically controlled conditions, and, e.g., protected from dust or other contamination.

It can be provided that during the retaining, no replication material (and neither the conditioning material) is deposited on the tool material.

In some embodiments, said other time duration is terminated by an exposure of the replication material to a replication material.

In some embodiments, the method includes carrying out at least two replication processes, in particular at least five replication processes, and during the conditioning of the replication tool, the tool material is exposed to the conditioning material for a time duration t1 and subsequently retained for a time duration t2 with the conditioning material removed from the tool material. And during each of the replication processes, the tool material is exposed to the replication material for a respective time duration referred to as exposure time and subsequently retained for a time duration referred to as retaining time. Optionally, the exposure times are identical for each of the replication processes. And optionally, the retaining times are identical for each of the replication processes. A target parameter can furthermore be defined for the devices.

Aiming at good reproducibility and/or at producing devices which all have very similar properties, such as very similar values for the target parameter, various conditions can be set. Some examples:

In some embodiments, values for the time durations t1 and t2 and for the exposure times and the retaining times satisfy the condition that for the devices produced in the replication processes, a mean deviation of target parameter values from a mean value of the target parameter values
is at most 70%, in particular at most 50%, more particularly at most 35%,
of a deviation from said mean value of the target parameter values of the devices produced in the replication processes, of a mean value of target parameter values of devices produced by hardening the conditioning material at the end of time duration t1.

In some embodiments, a target value of the target parameter is defined for the devices, and values for the time durations t1 and t2 and for the exposure times and the retaining times fulfill the condition that a mean deviation from the target value of target parameter values of the devices produced in the replication processes is smaller, in particular smaller by a factor of at least two, more particularly by a factor of at least three, than a mean deviation from the target value of the target parameter values of devices produced by hardening the conditioning material at the end of time duration t1.

In some embodiments, a target value of the target parameter is defined for the devices, and an acceptance band around the target value is defined for the devices, and values of the time durations t1 and t2 and of the exposure times and the retaining times fulfill the condition that a mean value of the target parameter of the devices produced in each the replication processes lies within the acceptance band.

In some embodiments, a mean value of the target parameter of devices produced by hardening the conditioning material at the end of time duration t1 lies outside the acceptance band.

In some embodiments, the acceptance band has a width, and a deviation from the target value of a mean value of the target parameter of devices produced by hardening the conditioning material at the end of time duration t1 differs from the target value by at least the width of the acceptance band, in particular by at least 1.5 times the width of the acceptance band.

In some embodiments, the times t1 and t2 and the exposure times and the retaining times are determined before carrying out the replication processes, in particular determined before the conditioning of the replication tool.

In some embodiments, the method includes, before the conditioning of the replication tool, carrying out test runs with one or more test replication tools which, e.g., can include identical tool material, e.g., with congeneric with replication tools, for determining the time durations t1 and t2 and the exposure times and the retaining times. In such test runs, suitable time durations t1 and t2 and the exposure times and the retaining times can be determined, e.g., such times which result in fulfilling a condition, such as fulfilling one or more of the above-described conditions.

In some embodiments, both, the replication material and the conditioning material, are materials which are liquid in an initial state and which can be transformed into a hardened state by exposure to energy. E.g., they can be curable materials.

In some embodiments, the replication material is a liquid epoxy resin and the conditioning material is a liquid epoxy resin, too.

In some embodiments, the replication material and the conditioning material are the same material. E.g., they can both be the same epoxy resin.

In some embodiments, the conditioning material is discarded after its removal from the replication tool.

In some embodiments, the devices produced by replication using the replication tool do not originate from the conditioning material.

In some embodiments, the devices produced by replication using the replication tool originate from material (the replication material) which is brought into contact with the tool material after the conditioning material is removed from the tool material.

In some embodiments, the replication tool is a wafer.

In some embodiments, the replication tool is a stamping tool, e.g., as for use in an embossing process.

In some embodiments, the method includes successively carrying out a plurality of the replication processes with the replication tool (after the conditioning). It is one possible effect of the method (and in particular of the conditioning) that dimensional changes of the replication tool from one replication process to a subsequent replication process are comparably small.

In some embodiments, in each of the successive replication processes, one or more devices of the multitude of devices are produced which are congeneric with one or more devices of the multitude of devices which are produced in any other one of the successive replication processes.

In some embodiments, the replication processes are embossing processes.

In a specific view, the method for manufacturing a multitude of devices includes:
providing a replication tool including a tool material;
conditioning the replication tool, the conditioning including applying a treatment to the tool material, the treatment including exposing the tool material to a conditioning material;
and the method further includes, after the conditioning:
manufacturing the multitude of devices by means of replication using the replication tool.

Also in this specific view, conditioning can include the retaining as described and the other described features and embodiments.

Further embodiments and advantages emerge from the following description and the enclosed figures and from the dependent claims.

BRIEF DESCRIPTION OF THE DRAWINGS

Below, the invention is described in more detail by means of examples and the included drawings. In the drawings, same reference numerals refer to same or analogous elements. The figures show schematically.

The described embodiments are meant as examples or for clarifying the invention and shall not limit the invention.

DETAILED DESCRIPTION OF THE INVENTION

Figure 1:
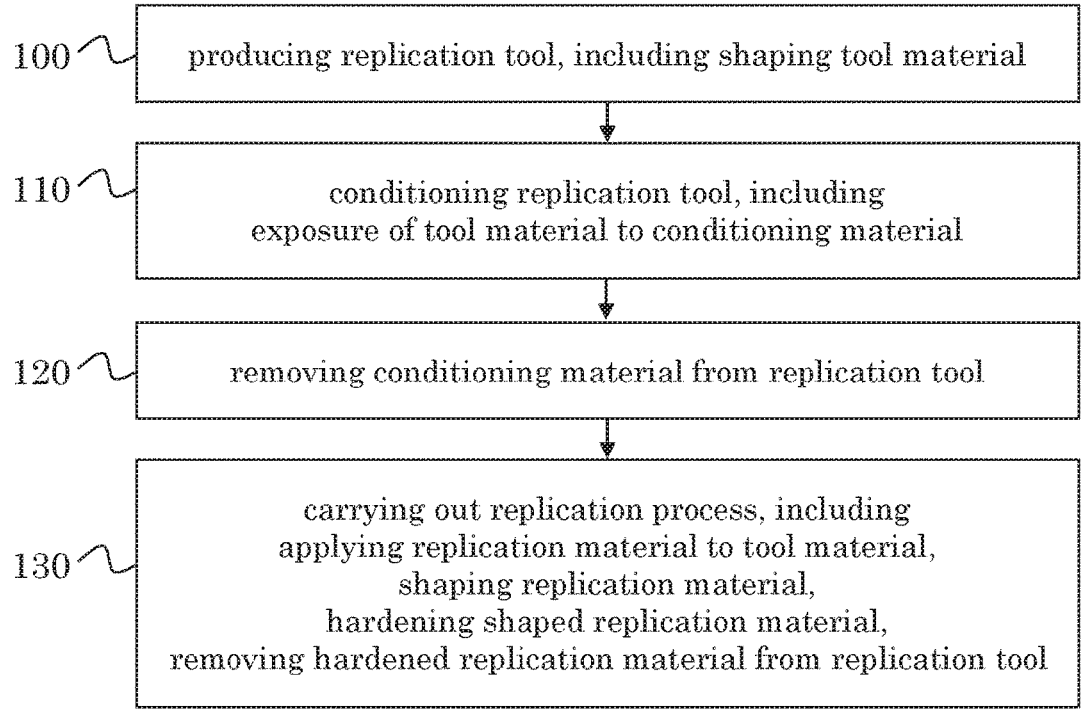
FIG. 1 a flow chart of a method for manufacturing devices by replication including conditioning of the replication tool.

FIG. 1 is a flow chart of a method for manufacturing devices by replication including conditioning of the replication tool. FIGS. 2 to 5 are schematical illustrations, in a cross-sectional view, of some steps of the method. The illustrated example refers to a replication process which is an embossing process.

In the following, manufacturing methods and replication tool conditioning methods are described with reference to FIG. 1 as well as to FIGS. 2 to 5.

In step 100, the replication tool is produced which can include shaping a tool material of the replication tool. This shaping can be accomplished, e.g., in a replication process.

Figure 2:
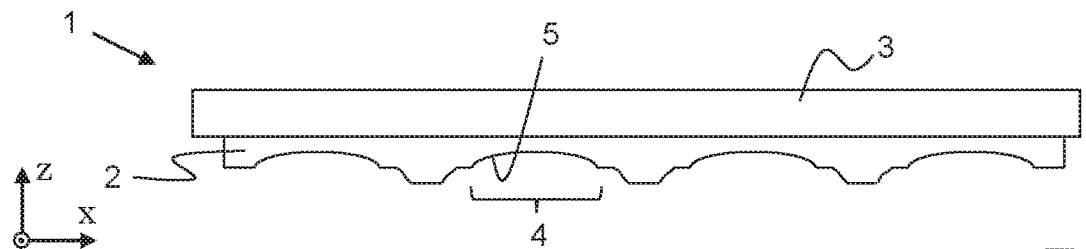
FIG. 2 a schematic illustration of a replication tool, in a cross-sectional view.

FIG. 2 schematically illustrates a replication tool 1 in a cross-sectional view which is a wafer-level replication tool for embossing. It includes a tool material 2 which adheres to a rigid carrier 3 such as a glass plate. The tool material establishes a number of replication sites 4, four of which are illustrated in FIG. 2. In each replication site, a replication surface 5 is provided which exhibits the negative of the shape of a surface of a device to be produced by replication using the replication tool 1.

Replication tool 1 includes mutually distanced replication sites, for the manufacture of separate devices by replication, such as a multitude of microlenses.

The tool material can be an resilient material, and it can be a material which is interspersed pores and/or channels.

The tool material can be a spongy material.

The tool material can be, e.g., a polydimethylsiloxane (PDMS).

In step 110, the replication tool 1 is conditioned before it is used for producing the devices by replication using the replication tool 1. The conditioning includes exposing the tool material 2 to a conditioning material 6, cf. FIG. 3. For this, the conditioning material 6 is applied to the tool material 2.

Figure 3:
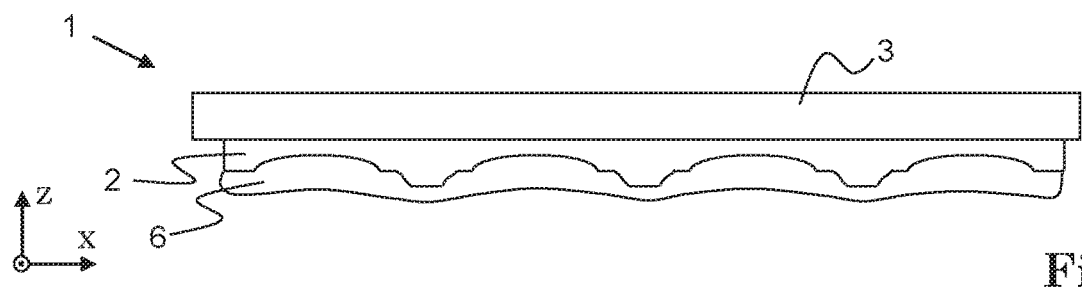
FIG. 3 a schematic illustration of the replication tool of FIG. 2 during exposure to conditioning material, in a cross-sectional view.
Figure 4A:
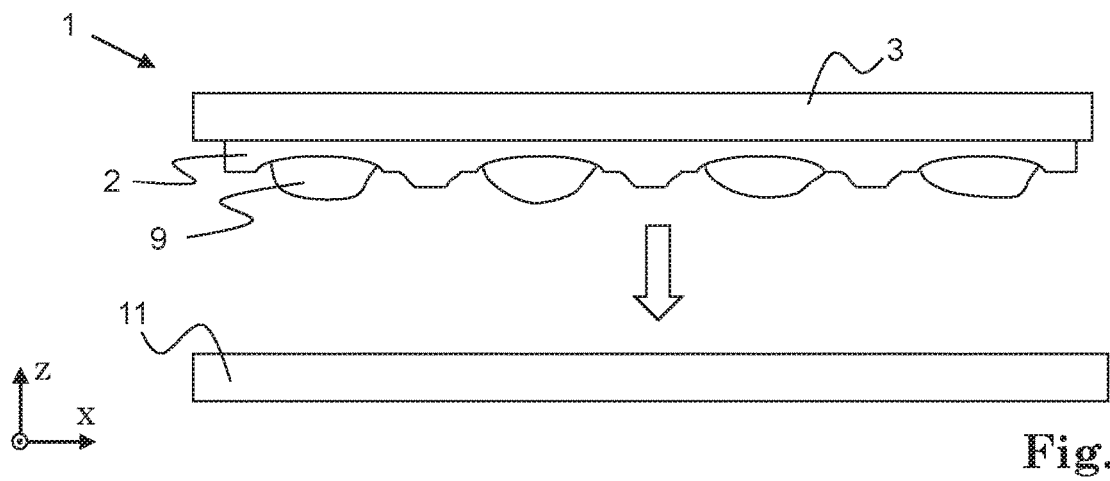
FIG. 4a a moving towards each other of the replication tool of FIGS. 2 and 3 and a substrate, with replication material therebetween in a cross-sectional view.

FIG. 3 is a schematic illustration of the replication tool 1 of FIG. 2 during exposure to the conditioning material 6, in a cross-sectional view. Each replication surface 4 is covered by the conditioning material 6. In the illustrated example, the tool material 2 is covered by the conditioning material 6 even in full (except, e.g., for side faces of the tool material). Alternatively, the conditioning material 6 could also be applied locally to the replication surfaces 5. This is not illustrated in FIG. 2, but may look similar to what is illustrated in FIG. 4a (cf. below)—of course, with conditioning material 6 instead of replication material 9; and a substrate such as substrate 11 in FIG. 4a may be applied as well.

The conditioning material 6 can be the same as a replication material 9 used later on in the replication processes (cf. step 130 and FIGS. 4 to 5). E.g., they can both be the same epoxy resin.

The exposure of the tool material 2 to the conditioning material 6 can last, e.g., 6 hours—which largely exceeds the time duration during which the tool material 2 will be exposed in subsequent replication processes (cf. step 130 and FIGS. 3 and 4). In reaction to the exposure to conditioning material 6, tool material 2 is slightly dimensionally changed, e.g., undergoes a slight swelling process.

For example, a portion of conditioning material 6 can afterwards be present in pores and channels of an open porous structure of tool material 2, wherein it can have replaced a portion of material, e.g., of PDMS precursors and uncured PDMS, respectively, present in the pores and channels prior to the exposure to conditioning material 6.

Subsequently, conditioning material 6 is removed from tool material 1, cf step 120. Thereupon, replication tool 1 can look nearly like illustrated in FIG. 2, wherein, however, very small dimensional changes would have taken place relative to the state before the conditioning—which make the difference.

A possible way of removing conditioning material 6 from replication tool 1 is to harden the initially liquid conditioning material 6, e.g., by exposing it to energy, such as by irradiating it with UV radiation and/or by heating it, and then to remove the hardened conditioning material. As mentioned above, conditioning material 6 can itself be a replication material, such as an epoxy resin or another curable material. The removal can be facilitated by using the above-mentioned substrate, which can be removed from the replication tool with the (hardened) conditioning material adhering to the substrate.

Before carrying out a replication process for manufacturing devices by replication using replication tool 1, cf. step 130, some time may pass. According to current understanding, the dimensional change of the tool material is partially undone during that time. The time can be, e.g., of the order of the duration of the exposure of the tool material to the (still liquid) conditioning material. During that time, the replication tool (with no conditioning material and no replication material attached) can simply be retained, e.g., shelved or otherwise stored. Protection from dust during that time can be valuable. And temperature and humidity control can be helpful for increased reproducibility.

In the replication process which in the illustrated embodiment is an embossing process, a replication material 9 is applied between tool material 2 and a substrate 11 which can be a rigid plate such as a glass plate. Replication material 9 can be applied locally, in a plurality of separate portions. In FIG. 4a, this is the case, and replication material 9 is applied to tool material 2, but, e.g., application to substrate 11 (in addition or alternatively) would be possible, too.

Figure 4B:
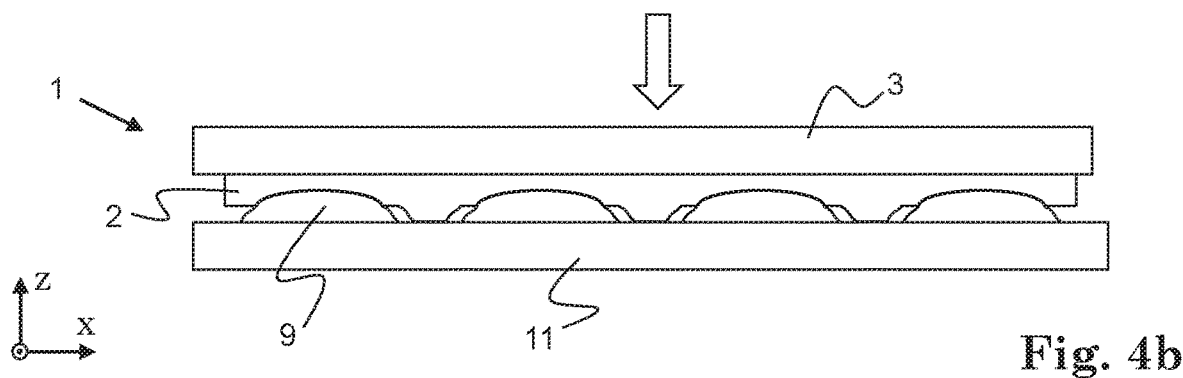
FIG. 4b a schematic illustration of shaping of replication material during an embossing process using the replication tool of FIGS. 2 and 3, in a cross-sectional view.

With replication material 9 between substrate 11 and replication tool 1 (more specifically: tool material 2), these two are moved towards each other, e.g., until they abut each other, cf. FIG. 4b. In this position, replication material 9 is shaped at the replication sites 4 of replication tool 1, and more particularly, each portion of the applied replication material 9 is shaped by one of the replication surfaces 5. At the same time, replication material 9 is in contact with substrate 11, too.

While maintaining the relative position of substrate 11 and replication tool 1, replication material 9 is hardened, e.g., cured, e.g., by UV irradiation and/or by application of heat.

The time duration during which the tool material 2 is exposed to replication material 9 in its initial state (i.e. before replication material 9 is hardened), can be, e.g. less than one hour, and in particular less than 10 minutes.

Figure 5:
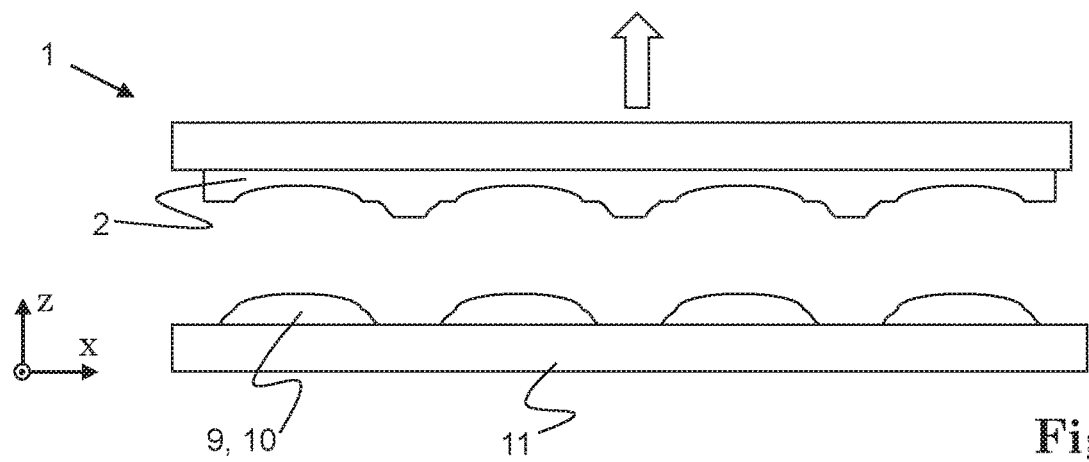
FIG. 5 a schematic illustration of a removal of the replication tool of FIGS. 2 to 4 from produced devices, in a cross-sectional view.

After the hardening process, a plurality of separate devices 10 is produced on substrate 11 each of which has a surface having a shape corresponding to the negative of the shape of one of the replication surfaces 5, and replication tool 1 is removed, cf. FIG. 5.

The dimensions of devices 10 can be very precisely predetermined by means of a suitable conditioning process as described, and they can decisively differ from the dimensions that would result without the conditioning process.

In mass production of devices 10 such as of passive optical components, e.g., of optical lenses, one and the same replication tool 1 can be used in several replication processes which are successively carried out. E.g., step 130 and the sequence of process steps described in conjunction with FIGS. 4 to 5, respectively, is repeatedly carried out.

Without subjecting the tool material 2 to the described conditioning process prior to the replication processes for the production of the devices 10, the devices 10 produced in the first couple of replication processes would have slightly but notably differing dimensions which would lead to a considerable number of rejects in high-precision manufacture. Only after several replication processes carried out with one and the same replication tool, sufficiently dimensionally stable results would possibly be achieved without the conditioning.

The conditioning, however, effects that devices 10 with only very little dimensional variations are produced already in the first couple of successive replication processes, such that little rejects occur already from the beginning.

Figure 6:
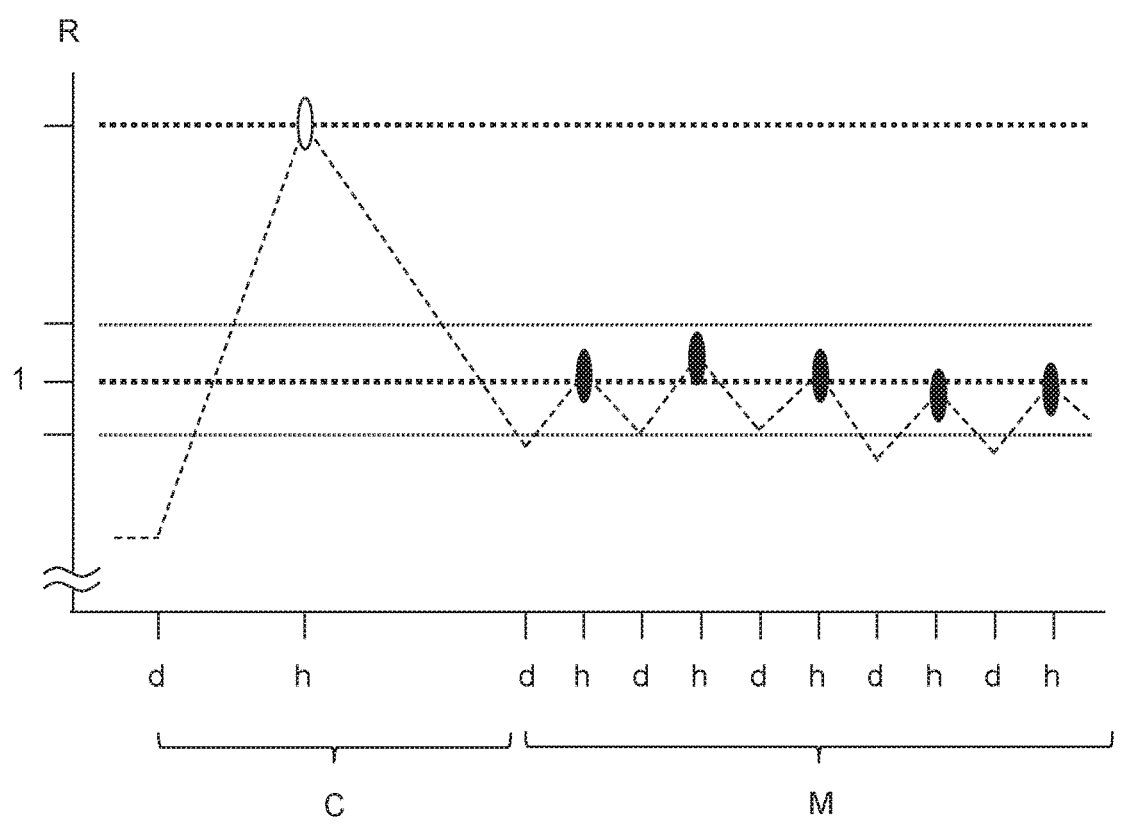
FIG. 6 a strongly schematized illustration of times and dimensions during conditioning and manufacturing.

FIG. 6 is a strongly schematized illustration of times and dimensions relevant during conditioning and manufacturing. It shall provide further insight into the manufacturing process and into the interrelation between conditioning and manufacturing. FIG. 6 is not to scale.

The x-axis of FIG. 6 roughly corresponds to a time axis, illustrating the steps which are carried out one after the other in the indicated order. The y-axis is indicative of a dimension of the replication tool or, more particularly, of the replication sites. Both axes are not to scale. The y-axis can thus be indicative of, e.g., a linear dimension of a feature of a replication surface and thus, be indicative, e.g., of a parameter ("target parameter") of a device produce, such of as a dimension ("target dimension") of a feature of a device produced, such as of a diameter of a microlens. Value R assigned to the y axis can thus be, e.g., a relative value relating a target dimension of a feature of a replication surface or of a feature of a replicated device to a desired value (or set value) thereof. E.g., R can be R=x/x0, wherein x is the target parameter, e.g., a diameter or a focal length, of a replicated microlens, and x0 is the corresponding desired value (or set value).

Indications "d" at the x-axis designate times when material (conditioning material and replication material, respectively) is applied to the replication tool, e.g., dispensed on the tool material using a dispenser. A substrate can afterwards be attached to the material, as discussed above. Indications "h" at the x-axis designate times when the material is hardened, e.g., cured, e.g, by UV irradiation. After hardening is completed, the hardened material is removed from the tool material, e.g., by removing the substrate (with the replicated devices attached) from the replication tool.

The ellipses in FIG. 6 indicate measured values of R or, more precisely, their centers indicate average values of R, averaged over all the devices produced in the respective run. The lengthy elliptic shape symbolizes that values of the target parameter tend to vary among a plurality of devices produced in a single replication process (and likewise in the conditioning process).

It is noted that frequently, a multitude of devices is produced on a single wafer. These devices do, in practice, of course have varying values of the target parameter. Therefore, the discussed values, in particular the values of R, can be understood as average values. And similarly, also the dimension of replication sites on the replication tool can be understood as average values.

Average values can be determined, e.g., as arithmetic averages.

A dashed line is drawn in FIG. 6 as a rough guide to the eye indicative of the time development of R. Of course, R is more likely to change rather in form of higher order polynomial functions or along exponential functions or the like. But for reasons of simplicity, straight lines are drawn in FIG. 6.

The curve for relative value R can be determined, e.g., by determining or measuring the respective feature dimension(s) of the replication tool at the desired time. Alternatively or in addition, at least the portions in which the dashed curve for R is rising, i.e. in the phases after application of the material to the tool material, can be determined, at least approximately, by hardening the material at the desired time and determining/measuring the respective target parameter (e.g., target dimension) of the replicated device.

Going from left to right on the x-axis and thus following the time development, and with reference, too, to FIG. 1:

After manufacture of the replication tool (cf. also step 100), conditioning material is applied to the tool material at the first "d", and R increases (step 110). Until hardening (at "h"), a relatively long time passes, and R assumes a maximum value, which not necessarily corresponds to a saturation value at which no further increase of R would occur even if the tool material would be still further exposed to the conditioning material. The maximum value can correspond to, e.g., 80% of such a saturation value.

After hardening, the conditioning material is removed and discarded (cf step 120). The corresponding devices are (usually) not within an acceptance band for the respective target parameter. However, e.g., for test purposes and/or for monitoring reproducibility, their target parameter values can be determined.

Such an acceptance band is indicated in FIG. 6 (thin dotted lines). E.g., devices may be acceptable if R is between 0.99 and 1.01; i.e. 1% deviation from the set value would be acceptable.

The maximum value can deviate from 1 by, e.g., more than the full width of the acceptance band. In FIG. 6, the maximum value of R deviates from 1 by more than twice the full width of the acceptance band.

Subsequently, it turns out that R decreases until it is exposed to the replication material (at the second "d"). During that time (retaining time), which can be even longer than the time of exposure to the conditioning material, the replication tool is reposited, e.g., is simply shelved.

The conditioning phase (designated "C" in FIG. 6) can end here, and the manufacturing phase (designated "M" in FIG. 6) can begin (cf step 130).

After the second "d", R increases again, but not very much, as not much time passes up to the hardening of the replication material at the second "h". R is within the acceptance band, and the replicated devices can therefore be used. It is, however, also possible to discard these firstly manufactured devices. E.g., they can be used to verify that they are indeed within the acceptance band. And/or they are discarded because they may contain contaminants possibly picked up during the retaining time or for other reasons.

Up to the next "d", R decreases again, but not very much, as not much time passes up to the next deposition of the replication material on the tool material at the third "d". Afterwards, R increases again until the next hardening process. And so on.

As is also readily understood, tests can be carried out for determining the times during the conditioning phase, namely for determining suitable values for the time of exposure to the conditioning material and for the time from hardening the conditioning material to the beginning of the following exposure to the replication material.

And, as is also readily understood, tests can be carried out (cf. below for an example) for determining suitable values for the time of exposure to the replication material and for the time from hardening the replication material to the beginning of the next exposure to the replication material during the manufacture—which can both be much shorter than the corresponding times during the conditioning phase.

The times to be used in the manufacturing phase M can be determined in dependence of the times used in the conditioning phase C or vice versa.

This way, optimized times can be determined, such that acceptable devices, e.g., devices with R within the acceptance band, can be reproducibly produced—with no or only very little rejects.

In an example, the times are considered suitable (acceptable/as desired) when they are selected such that for the devices produced in the replication processes (in the manufacturing phase), a mean deviation of target parameter values from a mean value of the target parameter values is at most 50% (or more particularly at most 35%)

of a deviation from said mean value of the target parameter values of the devices produced in the replication processes, of a mean value of target parameter values of devices produced in the conditioning phase (such as by hardening the conditioning material at the end of time duration t1).

In a very simple numeric example for this, merely two devices, e.g., two lenses, per replication tool (and, accordingly, also per replication process) are assumed, and the target parameter is, e.g., the lens diameter, and only two replication processes are carried out during the manufacturing phase. During the conditioning phase, one lens has a target parameter value (lens diameter) of 108 µm, and the other lens has a target parameter value of 112 µm. In the first replication process, the lenses have target parameter values of 102 µm and 104 µm, respectively, and in the second replication process, of 96 µm and 98 µm, respectively. Taking the arithmetic mean for calculating the mean values, we have, for the devices produced in the replication processes, a mean value of (102 µm+104 µm+96 µm+98 µm)/4=100 µm. Taking the standard deviation as the mean deviation, we have the square root of $((102-100)^2+(104-100)^2+(96-100)^2+(98-100)^2)/4$ in micrometers as the mean deviation for the devices manufactured during the manufacturing phase, which is the square root of 10 in micrometers and thus amounts to approximately 3.16 µm.

The mean value of the target parameter values of the lenses produced in the conditioning phase is (108 µm+112 µm)/2=110 µm. The deviation of this value from the above-calculated mean value of 100 µm thus is 10 µm. This deviation of 10 µm is more than three times the above-calculated mean deviation of approximately 3.16 µm. Accordingly, the times used for producing devices of this example do result in acceptable lenses.

If the condition for acceptability were that a mean deviation from a target value of target parameter values of the devices produced in the replication processes is smaller by a factor of at least two than a mean deviation from the target value of the target parameter values of devices produced by hardening the conditioning material at the end of time duration t1, the lenses of the above example would be acceptable if the target value is 100 µm. However, if the target value would be 110 µm, the lenses were not acceptable, and the times chosen would thus not be suitable.

If the condition for acceptability were that an acceptance band around the target value is defined for the devices produced in the manufacturing phase, and that a mean value of the target parameter of the devices produced in each the at least two replication processes lies within the acceptance band, the selected times would fulfill the condition and the lenses would be acceptable, if the acceptance band extends from, e.g., 94 µm to 104 µm (and the target value is, e.g., 100 µm). If, however, the acceptance band extends from 98 µm to 104 µm (and the target value is, e.g., 101 µm), the times used during conditioning and manufacture would not be suitable, because the mean value of the target parameter values in the second replication process is (96 µm+98 µm)/2=97 µm, which is outside the acceptance band.

Changes in R during the manufacturing phase M tend to be relatively small if the times used during the manufacturing phase M are relatively short. This can simplify to reproducibly produce acceptable devices.

In an example for determining suitable times, e.g., relatively short times (exposure times, retaining times) to be used during the manufacture can initially be selected. Then, test runs can be accomplished, using different replication tools including identical tool material, e.g., using congeneric replication tools. In the test runs, different times of exposure to the conditioning material and/or different values for the subsequent retaining time are selected, whereafter optionally, the values of the target parameter of the so-produced devices of the conditioning material are determined, e.g., by measuring a width of these devices. If the values of the target parameter in respective subsequent replication processes are as desired, e.g., because they lie within an acceptance band, suitable times are found. To find suitable times, one can, e.g., firstly select a time of exposure to the conditioning material and vary, in some test runs, the subsequent retaining time. If the result is not as desired, a different time of exposure to the conditioning material is selected and, again, the subsequent retaining time is varied in successive test runs. If then still, the result is not as desired, the exposure times and/or the retaining times can be varied in further test runs according to the before-described scheme (varying the times used during the respective conditioning phase).

Following the above scheme in a number of test runs, suitable times (during conditioning and during manufacturing) can be determined—such that devices are reproducibly produced in the manufacturing phase which, e.g., exhibit, at least to a high percentage, values of the target parameter which lie within an acceptance band, or devices which have values of the target parameter (in short: "target parameter values") which exhibit a mean deviation from a mean value of the target parameter values which is at most half as large as a deviation from said mean value of the target parameter values (during the manufacturing phase), of a mean value of the target parameter values of devices produced during the conditioning phase (i.e. produced by hardening the conditioning material at the end of time duration t1).

In the discussed examples, feature dimensions at the replication tool increase after application of the conditioning material and of the replication material, respectively. However, it may in instances be possible that they decrease.

The invention claimed is:

1. A method for manufacturing a multitude of devices, the method comprising:
provproviding a replication tool comprising a tool material;
conditioning the replication tool, wherein conditioning the replication tool includes applying a treatment to the tool material, the treatment including exposing the tool material to a conditioning material, the treatment further including dimensionally changing the tool material by uptake of the conditioning material in the tool material;
the method further comprising, after the conditioning:
carrying out one or more replication processes, wherein in each of the one or more replication processes, one or more of the devices are produced from a replication material by replication using the replication tool.

2. The method according to claim 1, wherein both, the replication material and the conditioning material, are materials which are liquid in an initial state and which can be transformed into a hardened state by exposure to energy.

3. The method according to claim 1, wherein the replication material is a liquid epoxy resin and the conditioning material is a liquid epoxy resin.

4. The method according to claim 1, wherein the replication material and the conditioning material are the same material.

5. The method according to claim 1, wherein the tool material is exposed to the conditioning material for a first time duration, and wherein in each of the one or more replication processes, the tool material is exposed to the replication material for a respective second time duration before hardening the replication material and removing the replication material from the replication tool, and wherein the first time duration exceeds each of the second time durations.

6. The method according to claim 1, wherein at least two replication processes are carried out, and
wherein during the conditioning of the replication tool, the tool material is exposed to the conditioning material for a time duration t1 and subsequently retained for a time duration t2 with the conditioning material removed from the tool material, and
wherein during each of the replication processes, the tool material is exposed to the replication material for a respective time duration referred to as exposure time and subsequently retained for a time duration referred to as retaining time, and
wherein a target parameter is defined for the devices.

7. The method according to claim 6, wherein values for the time durations t1 and t2 and for the exposure times and the retaining times satisfy the condition that
for the devices produced in the replication processes, a mean deviation of target parameter values from a mean value of the target parameter values is at most 70%, of a deviation from said mean value of the target parameter values of the devices produced in the replication processes, of a mean value of target parameter values of devices produced by hardening the conditioning material at the end of time duration t1.

8. The method according to claim 6, wherein a target value of the target parameter is defined for the devices, and wherein values for the time durations t1 and t2 and for the exposure times and the retaining times fulfill the condition that a mean deviation from the target value of target parameter values of the devices produced in the replication processes is smaller than a mean deviation from the target value of the target parameter values of devices produced by hardening the conditioning material at the end of time duration t1.

9. The method according to claim 6, wherein a target value of the target parameter is defined for the devices, and wherein an acceptance band around the target value is defined for the devices, and wherein the acceptance band has a width, and wherein values of the time durations t1 and t2 and of the exposure times and the retaining times fulfill the condition that a mean value of the target parameter of the devices produced in each the replication processes lies within the acceptance band.

10. The method according to claim 6, wherein the times t1 and t2 and the exposure times and the retaining times are determined before carrying out the replication processes.

11. The method according to claim 1, wherein the devices are either:
optical devices; or
passive optical components.

12. The method according to claim 1, wherein the tool material has an open porous structure and, optionally, wherein the treatment comprises letting the conditioning material permeate into the tool material.

13. The method according to claim 1, wherein the tool comprises one or more replication sites, the tool material establishing a replication surface in each of the one or more replication sites, and wherein the treatment comprises applying the conditioning material to each of the replication surfaces.

14. The method according to claim 1, wherein the treatment comprises exposing the tool material to the conditioning material for a time duration which is at least half as long as a time duration required for achieving a saturation of the tool material with the conditioning material.

15. The method according to claim 1, wherein the tool material is interspersed with one or more of pores and channels, wherein a portion of a fluid present in at least a portion of the pores and channels, respectively, prior to the treatment is replaced by the treatment by a portion of the conditioning material.

16. The method according to claim 1, wherein the tool material is a resilient material.

17. The method according to claim 1, comprising terminating the exposure of the tool material to the conditioning material by removing the conditioning material from the replication tool.

18. The method according to claim 1, wherein the conditioning material is a material which is liquid or plastically deformable in an initial state and which can be transformed into a hardened state by exposure to energy, and wherein during the exposure of the tool material to the conditioning material, the conditioning material is in its initial state.

19. The method according to claim 18, wherein the treatment comprises transforming the conditioning material into its hardened state and removing the hardened conditioning material from the replication tool.

20. The method according to claim 1, comprising, subsequent to the exposing of the tool material to the conditioning material, retaining the replication tool for another time duration, wherein said other time duration is terminated by an exposure of the replication material to a replication material.

* * * * *